United States Patent
Miller et al.

(10) Patent No.: US 6,537,895 B1
(45) Date of Patent: Mar. 25, 2003

(54) METHOD OF FORMING SHALLOW TRENCH ISOLATION IN A SILICON WAFER

(75) Inventors: Eric R. Miller, Colorado Springs, CO (US); Stephen R. Moon, Colorado Springs, CO (US)

(73) Assignee: Atmel Corporation, San Jose, CA (US)

( * ) Notice: Subject to any disclaimer, the term of this patent is extended or adjusted under 35 U.S.C. 154(b) by 0 days.

(21) Appl. No.: 09/713,513

(22) Filed: Nov. 14, 2000

(51) Int. Cl.$^7$ ............................................. H01L 21/76
(52) U.S. Cl. ...................... 438/427; 438/438; 438/700; 438/973; 257/521
(58) Field of Search .................... 438/700, 438, 438/427, 426, 424, 701, 713, 719, 973, FOR 227, FOR 435, FOR 458; 257/521, 301, 510, 513

(56) References Cited

U.S. PATENT DOCUMENTS

| | | | | |
|---|---|---|---|---|
| 3,883,948 A | * | 5/1975 | Allison | 29/557 |
| 3,920,482 A | * | 11/1975 | Russell | 148/1.5 |
| 3,986,200 A | * | 10/1976 | Allison | 357/55 |
| 4,569,698 A | * | 2/1986 | Feist | 148/1.5 |
| 4,570,325 A | * | 2/1986 | Higuchi | 29/576 W |
| 4,877,962 A | | 10/1989 | Ohsaki et al. | 250/442.1 |
| 5,401,998 A | * | 3/1995 | Chiu et al. | 257/368 |
| 5,576,230 A | | 11/1996 | Guldi | 437/41 |
| 5,583,368 A | * | 12/1996 | Kenney | 257/621 |
| 5,763,315 A | * | 6/1998 | Benedict et al. | 438/424 |
| 5,861,104 A | * | 1/1999 | Omid-Zohoor | 216/84 |
| 5,872,043 A | * | 2/1999 | Chen | 438/424 |
| 5,904,538 A | | 5/1999 | Son et al. | 438/424 |
| 5,913,133 A | | 6/1999 | Lee | 438/444 |
| 6,040,597 A | * | 3/2000 | Kim et al. | 257/321 |
| 6,078,078 A | | 6/2000 | Gardner et al. | 257/330 |
| 6,320,215 B1 | * | 11/2001 | Bronner et al. | 257/301 |
| 6,331,469 B1 | * | 12/2001 | Park et al. | 438/296 |
| 6,404,402 B1 | * | 6/2002 | Koh et al. | 343/772 |

OTHER PUBLICATIONS

U.S. patent application Publication US 2002/0057226 A1; Koh et al.*
"Characterization of Surface Mobility on the Sidewalls of Dry–Etched Trenches"; Petti et al.; pp. 104–107; IEEE; 1998.*
"Impact of Radical Oxynitridation on Characteristics and Reliability of Sub–1.5 nm–Thick Gate Dielectric FET's with Narrow Channel and Shallow–Trench Isolation"; Watanabe et al.; pp. 813–816; IEEE; 2001.*
"Vertical N–Channel MOSFET's for Extremely High Density Memories: The Impact of Interface Orientation on Device Performance"; Goebel et al.; pp. 897–906; IEEE Transactions on Electron Devices, vol. 48, No. 5; May 2001.*
S. Wolf and R.N. Tauber, "Silicon Processing for the VLSI Era", *Process Technology*, vol. 1, pp. 1–5 and 23.

* cited by examiner

*Primary Examiner*—George Fourson
*Assistant Examiner*—Fernando Toledo
(74) *Attorney, Agent, or Firm*—Thomas Schneck

(57) ABSTRACT

A method of forming a shallow trench isolation region in a silicon wafer which results in the elimination of long range slip dislocations in the wafer and reduces leakage current across the isolation regions. Long shallow trenches are formed in a silicon wafer at a 45 degree angle to the (111) plane of the wafer. This is achieved by moving the primary flat of the wafer to the (100) plane prior to the formation of the trenches, which causes the bottom edges of the long trenches to intersect with several (111) planes, so that stresses do not propagate along any one single (111) plane. The trenches are then filled with an insulative material, such as oxide.

7 Claims, 7 Drawing Sheets

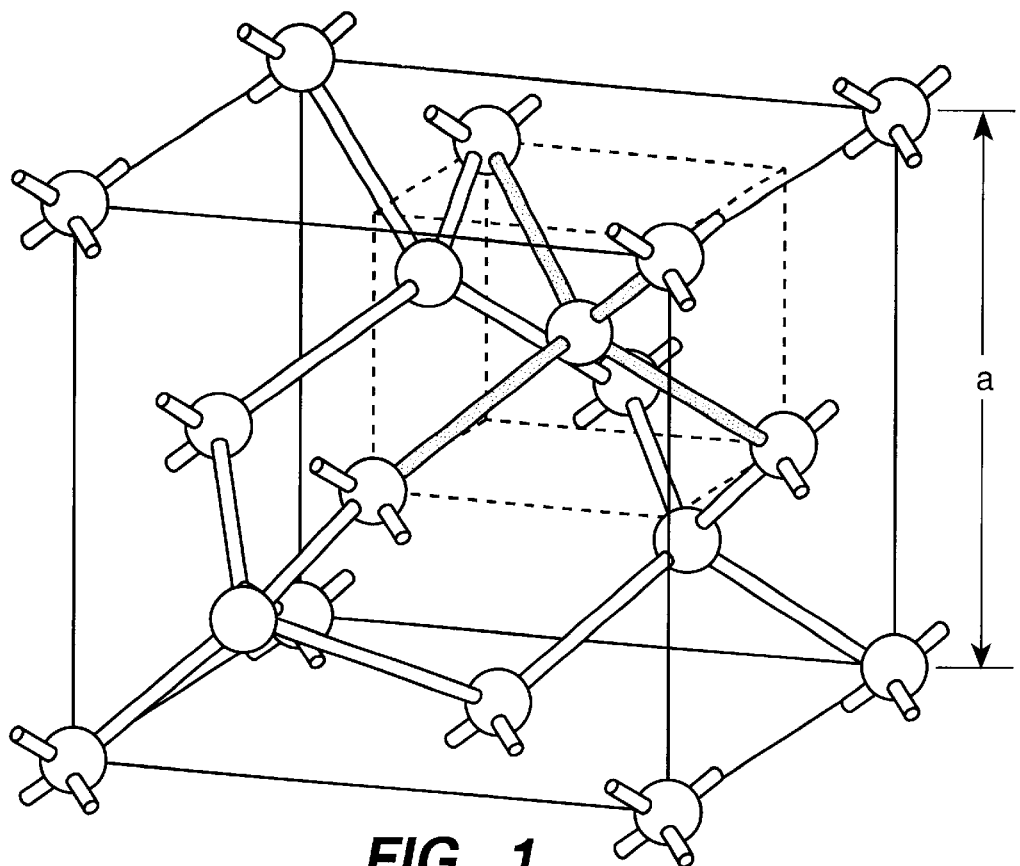
FIG._1
*(PRIOR ART)*
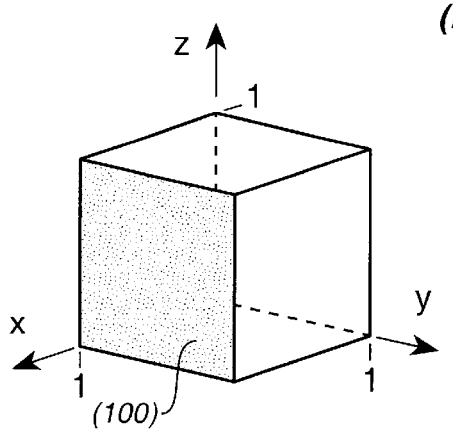
FIG._2A
*(PRIOR ART)*
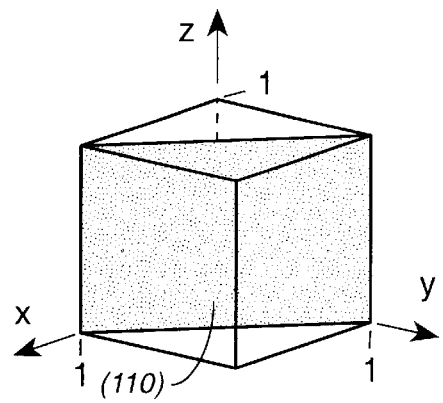
FIG._2B
*(PRIOR ART)*
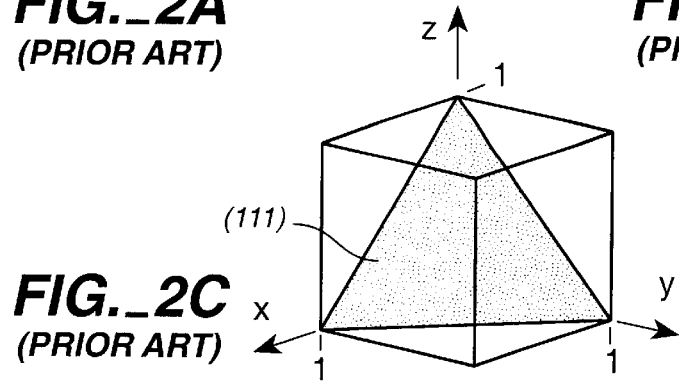
FIG._2C
*(PRIOR ART)*

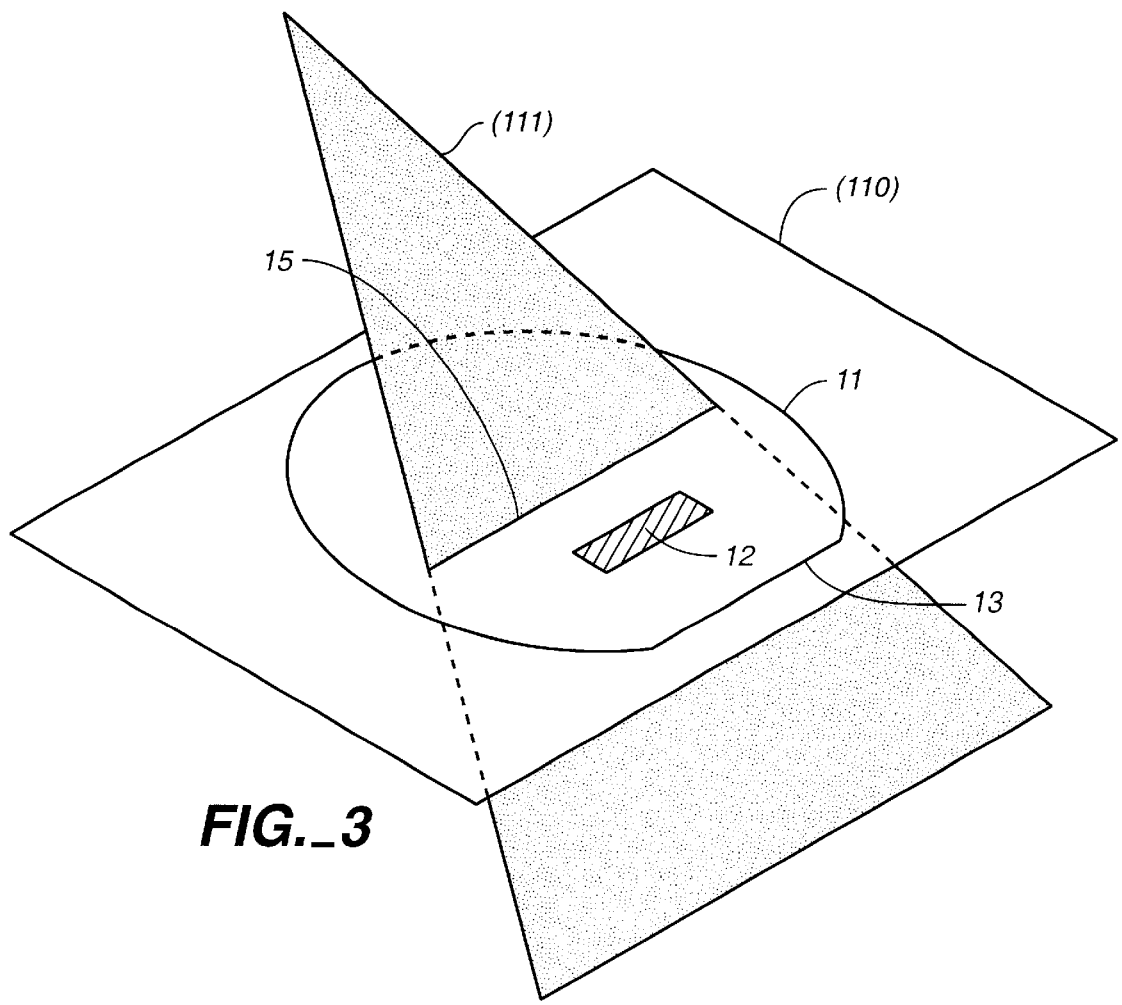
FIG._3
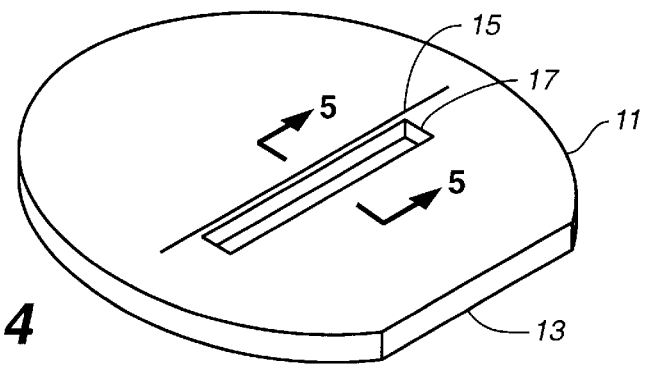
FIG._4

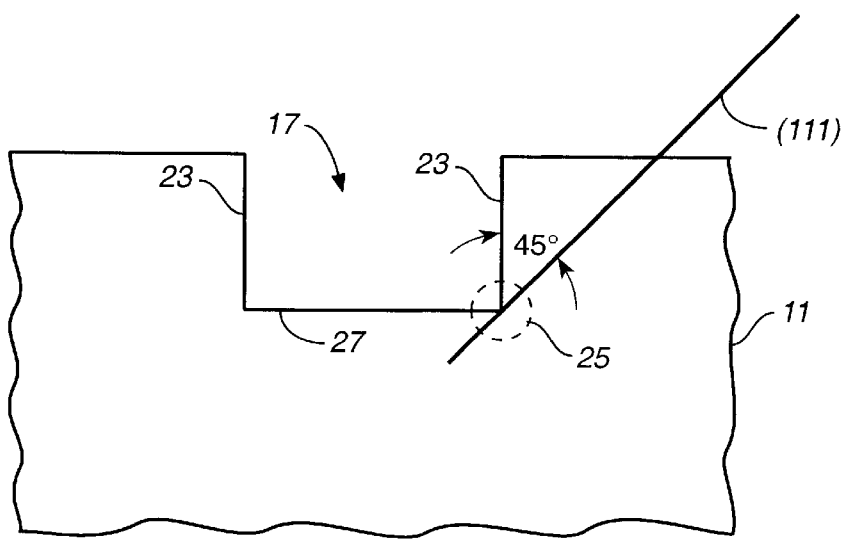
FIG._5
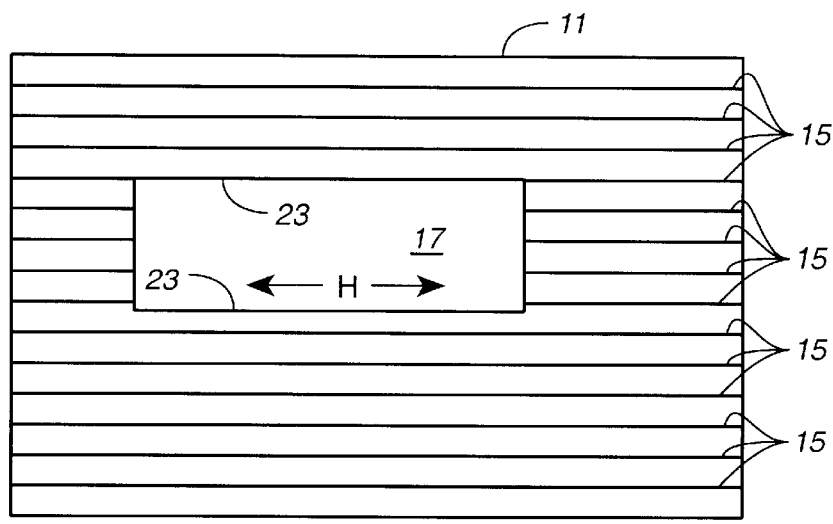
FIG._7
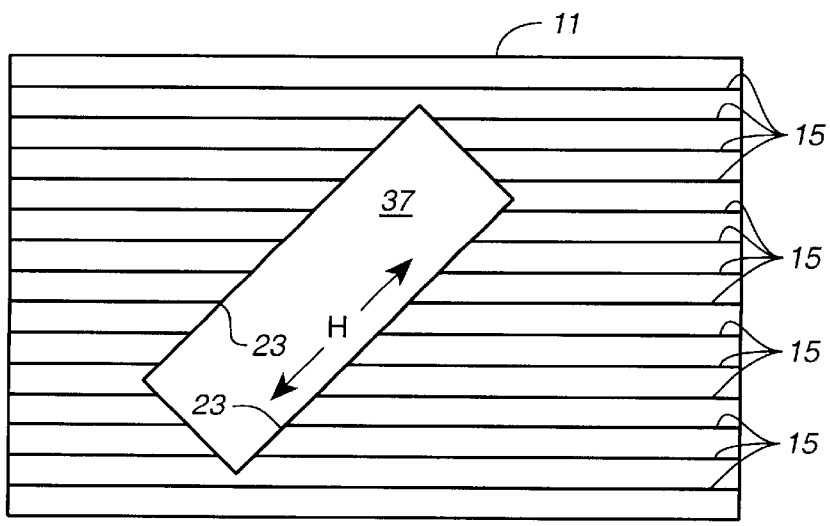
FIG._11

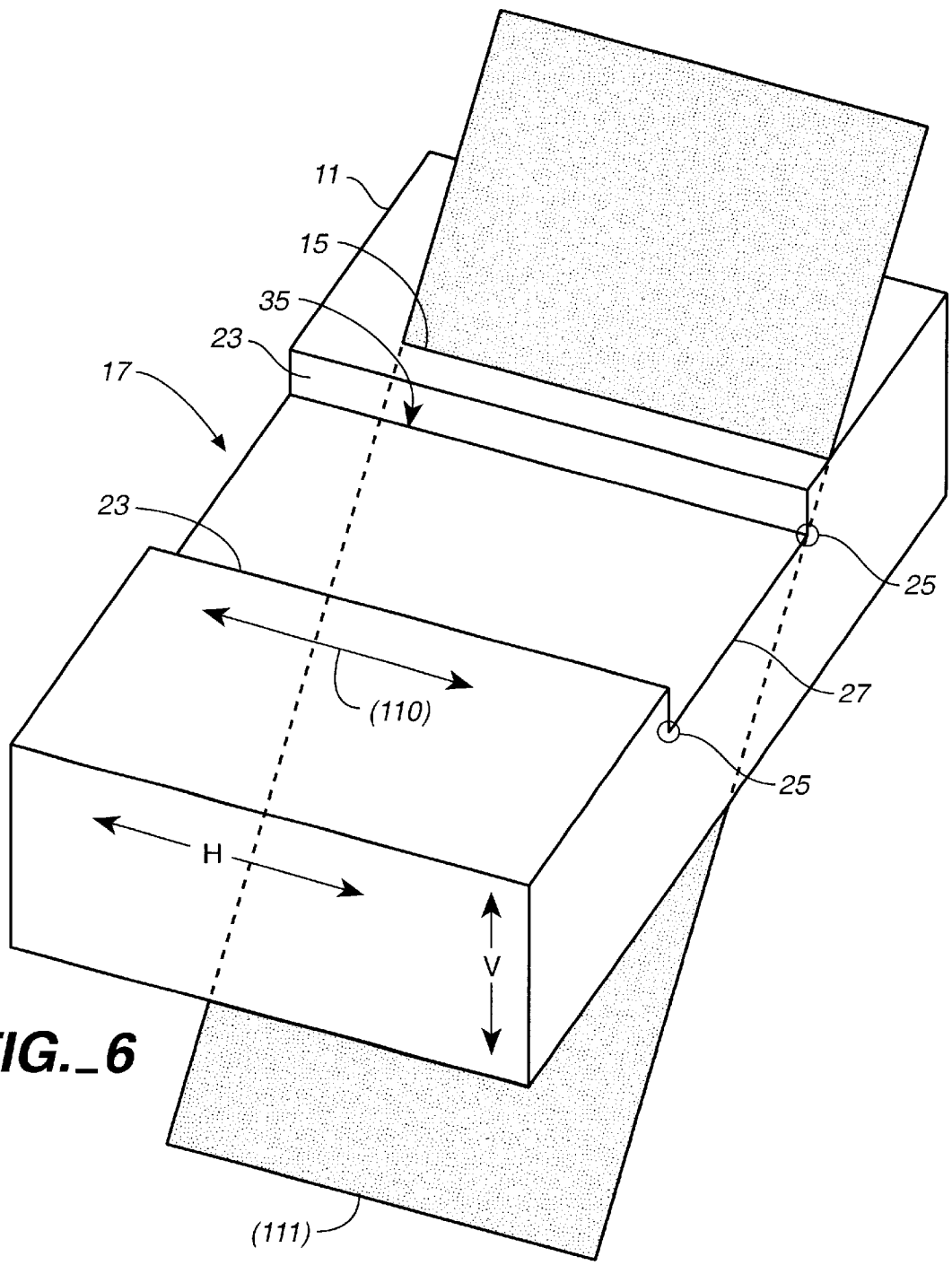
FIG._6

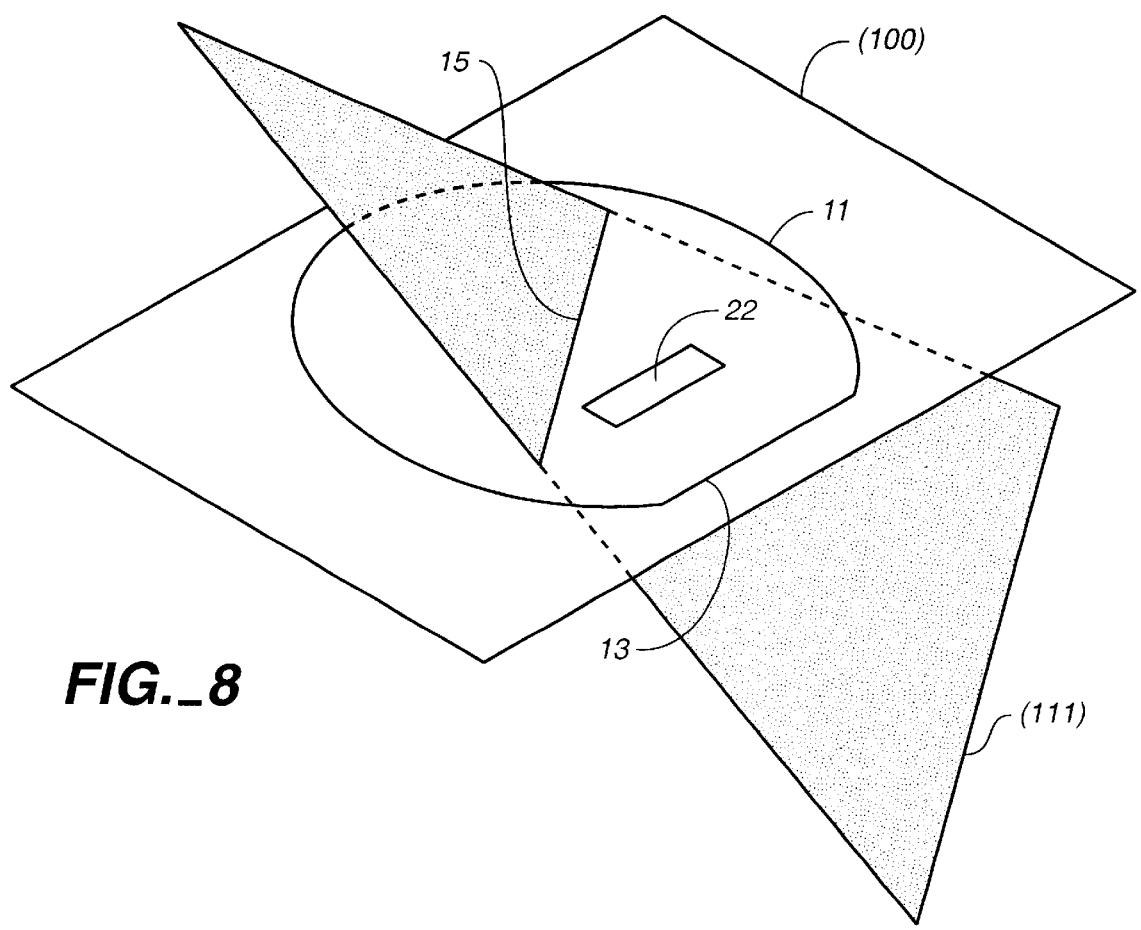
FIG._8

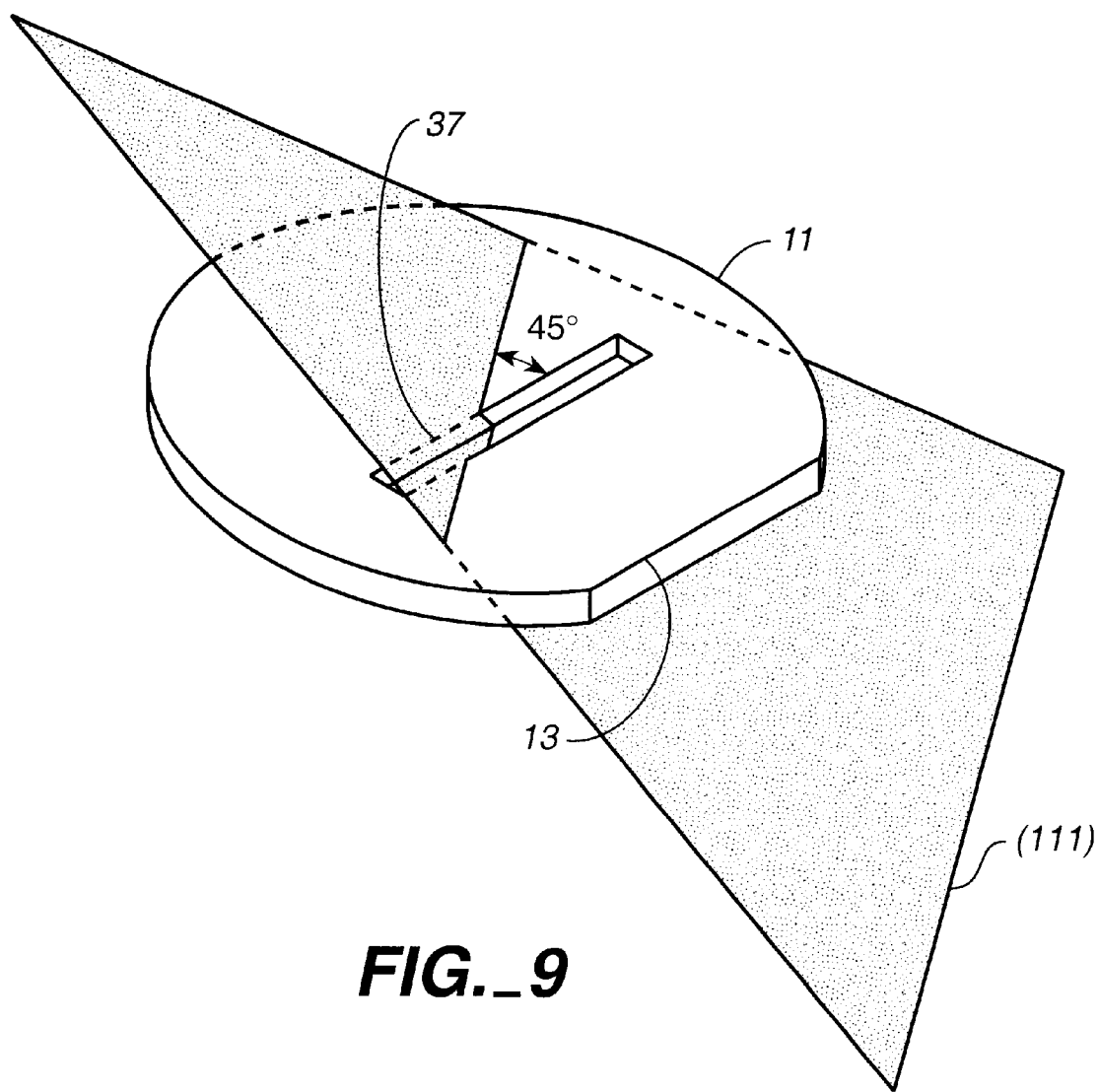
FIG._9

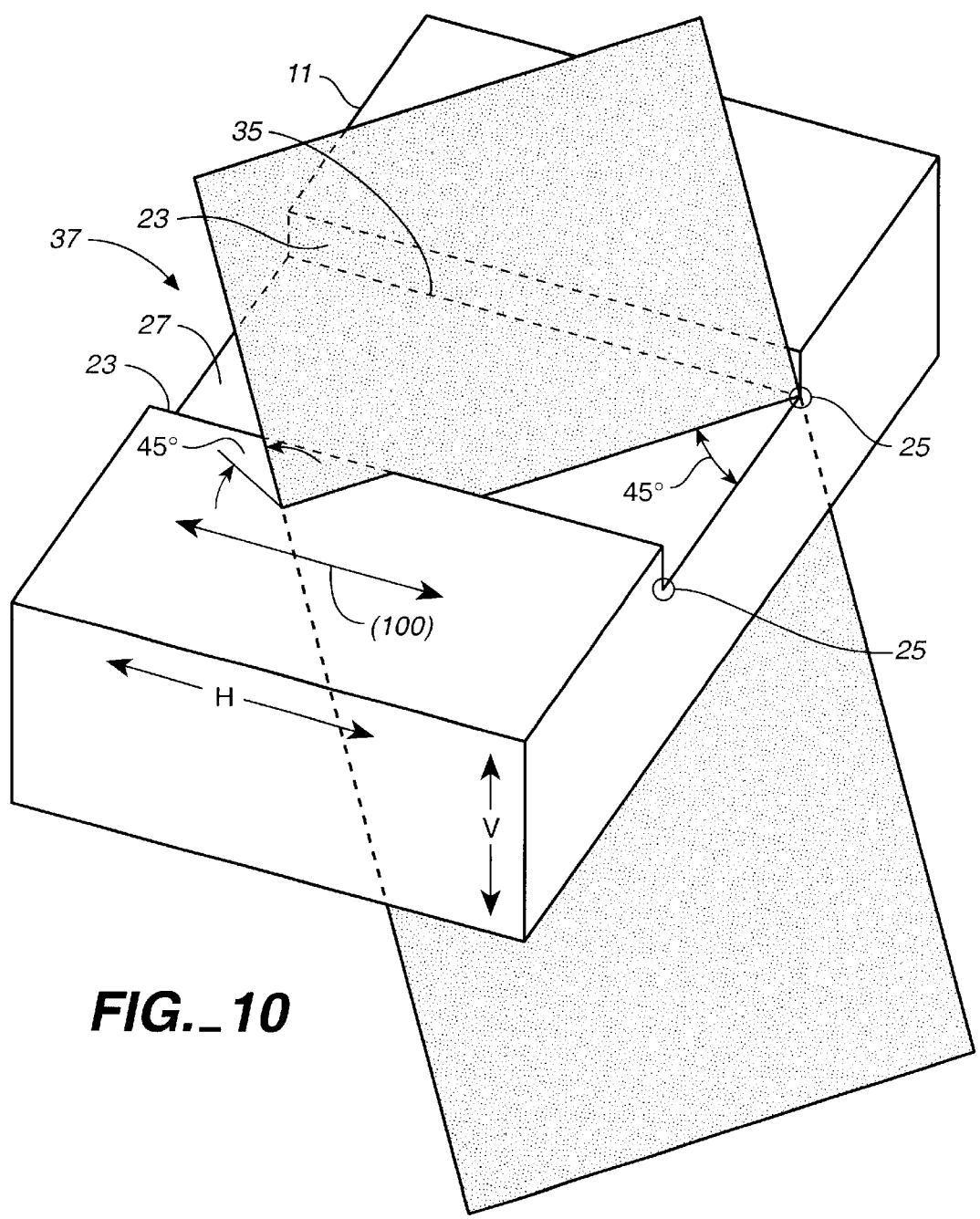
FIG._10

METHOD OF FORMING SHALLOW TRENCH ISOLATION IN A SILICON WAFER

TECHNICAL FIELD

The present invention relates to forming a shallow trench isolation (STI), and more specifically to a method of aligning the STI regions to reduce defects in silicon.

BACKGROUND ART

Semiconductor integrated circuits chips are constructed as dies on wafers. A typical wafer material is crystalline silicon. Wafers are cut from single crystal silicon ingots grown from more impure polysilicon by means of Czochralski, CZ, crystal growth. In CZ growth, single crystal ingots are pulled from molten silicon contained in a crucible. Czochralski silicon wafers, CZ wafers, are preferred for VLSI applications since they can withstand high thermal stresses and are able to offer an internal gettering mechanism that can remove unwanted impurities from the device structures on a wafer surface. This also gives the wafer a uniform internal structure based on silicon's diamond cubic lattice structure. Although the diamond cubic lattice provides strength and rigidity to the wafer, imperfections in the crystal lattice can adversely affect the wafer electrical properties leading to a reduction in the number of good dies per wafer.

Silicon, Si, is a column IV element and has four valence electrons, each of these electrons is shared with one of its four nearest neighbor Si atoms. Each pair of valence electrons shared between nearest neighbors form a covalent bond giving silicon its solid crystalline structure. The diamond cubic lattice structure of silicon is depicted in FIG. 1.

The crystal lattice structure of the wafer forms planes traversing it in multiple directions. Three principal planes are shown in FIG. 2. The orientation of these planes (111), (110) and (100) within respective illustrative cubic structures 22, 24 and 26 is shown. The direction of each plane is determined by taking a set of three vector components defining three axial directions x, y and z. All three cubes 22, 24 and 26 are aligned along the three x, y and z axial directions, and each cubic face has a unit length of one. In this coordinate system, a one indicates which axis the plane traverses. For example, the plane defined by (111) is shown traversing all three axes x, y and z. Similarly, plane (110) traverses the x and y axes, and plane (100) traverses only the x axis.

Many structural properties of silicon depend on its planar orientation. Plane (111) has the highest density of atoms and is packed very tightly. The tighter a plane is packed, the higher the probability that slip dislocation will occur. These dislocations can promote charge leakage that can lead to device failure.

Therefore, it is important to be able to identify crystalline planes on a wafer. To help identify these planes, wafers are typically constructed with a primary flat region relative to a selected crystal orientation. The primary flat orientation is identified by X-rays techniques, and is used for several purposes. For example, automated wafer handling equipment utilizes the primary flat to obtain correct alignment, and devices on a wafer can be oriented to specific crystal directions using the primary flat as a reference.

Typically, the primary flat of the wafer is aligned with plane (110). As a consequence, some constructed devices may have dimensions that are aligned along the more tightly packed planes. This traditionally has not been a problem since any defects formed had little influence on device performance and could be ignored.

Nonetheless, not all defects can be ignored and several techniques for reducing specific defects have been proposed. U.S. Pat. No. 5,576,230 to Guldi explains that microscopic dislocations can occur in the drain and source regions of an MOS transistor if recrystallization after ion implantation is allowed to proceed along multiple crystalline planes. These microscopic dislocations can grow under the application of stress from overlayers. Guldi suggests that if the drain and source regions are implanted at an angle, recrystallization may be promoted along a single plane, specifically plane (110), and limit recrystallization along other planes.

Because of the relatively large dimensions of isolation regions, structural defects in the substrate along the isolation regions are of special concern. U.S. Pat. No. 5,913,133 to Lee et al. explains that damage can occur to an isolation region due to misalignment of a mask. Lee states that the damage can be reduced by forming the isolation layer so that the edge portion of the isolation layer is not exposed to the surface of the substrate. U.S. Pat. No. 5,904,538 to Jeong-Hwan Son et al. shows a method for developing shallow trench isolation regions, STI, in a semiconductor memory device by implanting fluorine ions in a semiconductor substrate where the trench is to be formed before forming the trench. Fluorine ions are diffused at opposing sides along the upper corners of the trench next to the substrate surface. The fluorine ions protect the isolation region from light exposure and thereby reduce damage.

These approaches attempt to reduce defects through specific changes to the IC fabrication process. Another approach to reducing defects is to improve the quality of the wafer itself. One method of doing this is through an epitaxial growth process that deposits a thin layer of single crystal material upon the surface of a single crystal substrate. Such wafers are known as epi wafers. Circuit structures can be constructed in a thin, lightly doped epitaxial layer over a heavily doped substrate. Experimentation with these types of wafers have shown that they have higher yields than standard polished wafers. Currently, however, wafers with an epitaxial substrate are more than twice as expensive as standard polish wafers and their benefit does not outweigh their high cost.

It is an object of the present invention to reduce defects, such as slip dislocation and gettering points for impurities, in an IC substrate.

It is another object of the present invention to improve isolation regions in a substrate with minimal increase in cost.

It is still another object of the invention to provide a process of constructing STI isolation regions that reduces defects due to the inherent crystalline structure of silicon.

SUMMARY OF THE INVENTION

Applicants have found that as device dimensions continue to shrink and thermal cycling continues to increase, substrate quality is becoming more critical to device performance. Trench formation, such as STI and LOCOS, causes significant stress concentration points, such as gettering points for impurity and other silicon defects.

It has been found that etching the wafer along plane (110) causes the STI islands to align themselves in both vertical and horizontal directions with plane (111). This effect results from the relative orientation of plane (111) to plane (110). As the trench is formed, its curvature aligns itself with plane (111). This alignment with plane (111) reduces the quality of the wafer since plane (111) is very tightly packed and susceptible to slippage and other dislocation defects.

It has been found that by moving the primary flat forming of a CZ wafer by 45° from plane (110) to plane (100), the trench formation will no longer be aligned with plane (111). In this case, the trench will go through plane (111) at a 45° angle. It has been found that this significantly reduces stress propagation/relief along the (111) direction and thereby reduces defects, especially at the STI corners.

BRIEF DESCRIPTION OF THE DRAWINGS

FIG. 1 shows the diamond cubic lattice structure of silicon, as is known in the art.

FIG. 2 is a prior art view showing three principal planes of the diamond cubic lattice structure of silicon.

FIG. 3 shows the orientation of plane (111) and plane (110) with respect to a silicon wafer.

FIG. 4 is a perspective view of a silicon wafer showing a trench region aligned with plane (110).

FIG. 5 is a two dimensional view of a cut out region of the silicon wafer shown in FIG. 4.

FIG. 6 is a perspective view of the structure of FIG. 5 showing plane (111) traversing the substrate.

FIG. 7 shows the relationship between a series of (111) planes and a trench oriented along plane (110).

FIG. 8 shows the relationship of plane (111) and plane (100) with respect to a silicon wafer in accord with the present invention.

FIG. 9 shows a perspective view of a silicon wafer having a trench region aligned with plane (100).

FIG. 10 is a perspective view of a cut out region of the structure of FIG. 9 showing plane (111) traversing the substrate in accord with the present invention.

FIG. 11 shows the relationship between a series of (111) planes and a trench in accord with the present invention.

DETAILED DESCRIPTION OF THE INVENTION

With reference to FIG. 3, a wafer 11 is shown having a linear region referred to in the art as a flat, 13. Flat 13 is used as a reference in the construction of electrical components, such as circuit element 12, on wafer 11. The orientation of flat 13 is identified using X-ray techniques known in the art. In the present example, flat 13 is aligned with plane (110), as is typical in the art. Since circuit structures are typically aligned with the flat, of a wafer, circuit element 12 constructed on wafer 11 is likewise aligned with plane (110). Plane (111) traverses the surface of wafer 11, i.e. plane (110), at a 45° angle and is shown having a triangular shape for the purpose of this description. A symbolic line of interception 15 is used to represent the junction of plane (111) with the surface of wafer 11 as plane (111) extends beyond the boundaries of wafer 11. Since flat 13 is aligned with plane (110), line of interception 15 is also necessarily parallel to flat 13. Therefore, circuit element 12 is likewise parallel to interception line 15.

With reference to FIG. 4, a perspective view of wafer 11 is shown. For illustrative purposes, circuit element 12 of FIG. 3 is implemented as an exaggerated large trench region 17. A trench is an initial process step in the construction of shallow trench isolation region, STI, used to isolate active areas of an integrated circuit. The STI isolation region would be completed by filling trench 17 with an insulative material, such as oxide. The STI isolation region limits charge leakage between active areas of a substrates. A trench structure is used in the present discussion since isolation regions are relatively large structures on integrated circuits and Applicants have found that structural defects often concentrate along their path as their relative sizes are increased. Specifically, they are prone to dislocation errors. Applicants have further found that as device structure continue to decrease in size and modern process methods continue to increase thermal cycles, these dislocation errors can act as gettering points for impurities and create worm holes.

In FIG. 4, plane (111) is not shown, but its line of interception 15 with wafer 11 is shown parallel to flat 13. Plane (111) would traverse wafer 11 at 45° angle. Line 5—5 indicates the orientation of a two dimensional cut-out view of trench 17 shown in FIG. 5.

With reference to FIG. 5, trench 17 is shown to cut into wafer 11 and form a valley having corner regions 25, substantially vertical walls 23, and a floor 27. As explained above, walls 23 of trench 17 are aligned along plane (110). As a direct result, plane (111) aligns itself with corner regions 25 and along trench walls 23. Plane (111) forms a 45° angle with trench walls 23 and with the surface of wafer 11.

In FIG. 6, a partial perspective view of wafer 11 shows it aligned in the (110) direction. Trench region 17 is again shown having trench walls 23, floor 27 and corner regions 25. Directional arrow H indicates the horizontal direction and directional V indicates the vertical direction. Plane (111) is shown traversing wafer 11 at a 45° angle and forming a line of interception 15. As explained above, trench walls 23 and floor 27 meet and form corner regions 25 along plane (111). The running junction edge 35 of walls 23 and floor 27 is therefore aligned with plane (111) in the horizontal direction H. Since plane (111) represents stacks of planes define by the diamond cubic structure of silicon, walls 23 are also aligned with plane (111) in the vertical direction V.

Due to the structural properties of silicon, plane (111) has a high density of atoms packed very tightly. Since plane (111) is aligned with running junction edge 35, this running junction edge region, is susceptible to the formation of slip and other dislocation defects.

Referring to FIG. 7, multiple lines of interception 15 on the surface of wafer 11 are shown. Each line of interception 15 is indicative of the interception path a respective plane (111) would form if it were projected out of wafer 11, as previously shown in FIGS. 3 to 6. The horizontal direction of trench 17 is again identified by direction arrow H. As explained above, the horizontal direction H of trench walls 23 is aligned with line of interception 15. This facilitates the propagation of structural defects along plane (111).

In FIG. 8, the flat 13 of wafer 11 is moved 45° from its initial position, which was along the (110) direction, previously showing in FIG. 3. This results in flat 13 being effective aligned along the (100) direction. As a result, new circuit element 22 is aligned with new flat 13 and is likewise aligned along plane (100) of wafer 11.

As in the previous case, plane (111) still traverses wafer 11 at 45°, but it now also forms a 45° angle with flat 13. Thus, line of interception 15 between wafer 11 and plane (111) is no longer aligned with new circuit element 22. Circuit element 22 makes a 45° angle with line of interception 15.

With reference to FIG. 9, flat 13 of wafer 11 is shown having the same orientation as in FIG. 8. Circuit element 22 is implemented a new trench region 37, which is aligned with flat 13. The line of interception 15 between plane (111) and the surface of wafer 11 crosses trench 37 at a 45° angle.

FIG. 10 is a perspective view of wafer 11 showing trench 37 aligned in the (100) direction. As described above, wafer 11 has trench walls 23, trench floor 27 and corner regions 25. The horizontal and vertical directions are indicated as H and V, respectively. Plane (111) is shown traversing wafer 11 at a 45° angle and forming a 45° angle with walls 23. Trench walls 23 and trench floor 27 meet and form running junction edge 35 aligned along the horizontal direction. As a result, running junction edge 35 and corner regions 25 are no longer aligned with plane (111). Since trench 37 intercepts the (111) planes at a 45° angle, the slip planes formed by the (111) planes cannot align themselves within the trench region 37 and the formation of defects, especially along corner areas 35, 25 are reduced or eliminated. A top view of this configuration, shown in FIG. 11, better illustrates the interception of trench region 37 and the (111) planes.

FIG. 11 shows multiple lines of interception 15 across wafer 11. Each line of interception 15 again represents the interception path of a series of (111) planes projecting out of wafer 11. The relative orientation of trench 37 on wafer 11 is also shown.

The horizontal direction H of trench walls 23 is not aligned with interception lines 15. Rather, trench 37 crosses lines of interception 15 at a 45° angle. This structure breaks the alignment of the slip planes produced by the (111) planes and thereby reduces dislocation defects.

What is claimed is:

1. A method of forming shallow trench isolation in a silicon wafer having a primary flat, comprising:

aligning the wafer primary flat orientation in a direction of a vertical (100) plane of the silicon wafer;

forming a trench in the wafer, said trench having a pair of opposed walls that are in alignment with a (100) plane and a floor meeting each of said walls to form a pair of junction edges, said junction edges having corner regions at each end corresponding to a vertical edge of one of said walls; and refilling the trench with an insulative material.

2. The method of claim 1 wherein the walls of the trench are not aligned with a (111) plane of the silicon wafer.

3. The method of claim 2 wherein the (111) plane of the silicon wafer forms a 45 degree angle with the walls of the trench.

4. The method of claim 1 wherein the insulative material is oxide.

5. The method of claim 1 further comprising:

forming a plurality of trenches in the wafer, each of the trenches having walls oriented at a 45 degree angle with a (111) plane of the wafer.

6. A method of forming shallow trench isolation in a silicon wafer, comprising:

aligning a primary wafer flat orientation in a direction of a vertical (100) plane of the silicon wafer;

forming a plurality of long shallow trenches in the wafer, each of said trenches having a pair of opposed walls that are in alignment with a (100) plane and a floor meeting each of said walls to form a pair of junction edges, said junction edges having corner regions at each end corresponding to a vertical edge of one of said walls, said walls being oriented at a 45 degree angle with a (111) plane of the wafer; and refilling the trench with an insulative material.

7. The method of claim 6 wherein the insulative material is oxide.

* * * * *